(12) United States Patent
Paek et al.

(10) Patent No.: US 9,484,331 B2
(45) Date of Patent: Nov. 1, 2016

(54) SEMICONDUCTOR DEVICE AND MANUFACTURING METHOD THEREOF

(71) Applicant: Amkor Technology, Inc., Chandler, AZ (US)

(72) Inventors: Jong Sik Paek, Incheon (KR); Doo Hyun Park, Gyeonggi-do (KR)

(73) Assignee: Amkor Technology, Inc.

( * ) Notice: Subject to any disclaimer, the term of this patent is extended or adjusted under 35 U.S.C. 154(b) by 0 days.

(21) Appl. No.: 14/313,724

(22) Filed: Jun. 24, 2014

(65) Prior Publication Data
US 2015/0221573 A1 Aug. 6, 2015

(30) Foreign Application Priority Data
Feb. 4, 2014 (KR) .................. 10-2014-0012762

(51) Int. Cl.
*H01L 25/10* (2006.01)
*H01L 23/00* (2006.01)
(Continued)

(52) U.S. Cl.
CPC ........... *H01L 25/105* (2013.01); *H01L 21/568* (2013.01); *H01L 24/19* (2013.01); *H01L 23/5389* (2013.01); *H01L 24/13* (2013.01); *H01L 24/16* (2013.01); *H01L 24/32* (2013.01); *H01L 24/48* (2013.01); *H01L 24/73* (2013.01); *H01L 24/81* (2013.01); *H01L 24/92* (2013.01); *H01L 2224/0401* (2013.01); *H01L 2224/04042* (2013.01); *H01L 2224/04105* (2013.01); *H01L 2224/12105* (2013.01); *H01L 2224/131* (2013.01); *H01L 2224/13147* (2013.01); *H01L 2224/16225* (2013.01); *H01L 2224/32225* (2013.01); *H01L 2224/48091* (2013.01); *H01L 2224/48227* (2013.01); *H01L 2224/73204* (2013.01); *H01L 2224/73253* (2013.01); *H01L 2224/73267* (2013.01); *H01L 2224/81005* (2013.01); *H01L 2224/81203* (2013.01); *H01L 2224/81815* (2013.01); *H01L 2224/85* (2013.01); *H01L 2224/92125* (2013.01);
(Continued)

(58) Field of Classification Search
None
See application file for complete search history.

(56) References Cited

U.S. PATENT DOCUMENTS

| 6,740,964 | B2 | 5/2004 | Sasaki |
| 8,004,095 | B2 * | 8/2011 | Shim et al. ................... 257/787 |

(Continued)

FOREIGN PATENT DOCUMENTS

| KR | 2010-0005-3762 A | 5/2010 |
| KR | 2012-009-4712 A | 8/2012 |
| KR | 10-2013-0052179 A | 5/2013 |

OTHER PUBLICATIONS

Zohni, Wael (Invensas Corporation), Ultra high-bandwidth PoP infrastructure development, 4 pages, Nov.-Dec. 2013.
(Continued)

*Primary Examiner* — Joseph Schoenholtz
(74) *Attorney, Agent, or Firm* — McAndrews, Held & Malloy, Ltd.

(57) ABSTRACT

A semiconductor device and manufacturing method thereof. Various aspects of the disclosure may, for example, comprise forming a back end of line layer on a dummy substrate, completing at least a first portion of an assembly, and removing the dummy substrate.

26 Claims, 4 Drawing Sheets

(51) Int. Cl.
   *H01L 21/56* (2006.01)
   *H01L 23/538* (2006.01)

(52) U.S. Cl.
   CPC . *H01L 2225/107* (2013.01); *H01L 2225/1011* (2013.01); *H01L 2225/1023* (2013.01); *H01L 2225/1035* (2013.01); *H01L 2225/1041* (2013.01); *H01L 2225/1058* (2013.01); *H01L 2924/00014* (2013.01); *H01L 2924/12042* (2013.01); *H01L 2924/15311* (2013.01); *H01L 2924/15331* (2013.01); *H01L 2924/181* (2013.01); *H01L 2924/18161* (2013.01); *H01L 2924/18162* (2013.01); *H01L 2924/19107* (2013.01); *H01L 2924/3511* (2013.01)

(56) References Cited

U.S. PATENT DOCUMENTS

| | | | |
|---|---|---|---|
| 9,064,718 B1* | 6/2015 | Muniandy et al. | |
| 2007/0069389 A1* | 3/2007 | Wollanke et al. | 257/777 |
| 2009/0008765 A1* | 1/2009 | Yamano et al. | 257/690 |
| 2009/0085201 A1* | 4/2009 | Mathew | 257/734 |
| 2009/0140442 A1* | 6/2009 | Lin | H01L 21/565 257/778 |
| 2010/0140772 A1* | 6/2010 | Lin et al. | 257/686 |
| 2011/0254156 A1* | 10/2011 | Lin | 257/737 |
| 2012/0056329 A1* | 3/2012 | Pagaila et al. | 257/774 |
| 2012/0211885 A1 | 8/2012 | Choi | |
| 2013/0062761 A1* | 3/2013 | Lin | H01L 23/49816 257/738 |
| 2013/0168849 A1* | 7/2013 | Scanlan | 257/737 |
| 2014/0103488 A1* | 4/2014 | Chen | H01L 23/5389 257/532 |
| 2014/0217604 A1* | 8/2014 | Chou | H01L 24/11 257/774 |
| 2014/0217619 A1* | 8/2014 | Zhao et al. | 257/784 |
| 2014/0246779 A1* | 9/2014 | Lin et al. | 257/773 |
| 2014/0264933 A1* | 9/2014 | Yu et al. | 257/774 |
| 2014/0319661 A1* | 10/2014 | Pagaila | 257/659 |
| 2015/0044819 A1* | 2/2015 | Lin | H01L 23/49816 438/107 |
| 2015/0155203 A1* | 6/2015 | Chen | H01L 24/83 438/107 |
| 2015/0162220 A1* | 6/2015 | Chou | H01L 24/11 438/124 |
| 2015/0194388 A1* | 7/2015 | Pabst | H01L 23/552 257/659 |

OTHER PUBLICATIONS

Invensas™ BVA PoP for Mobile Computing: Untra-High IO withoug TSVs, 4 pages, Jun. 26, 2012.

\* cited by examiner

SEMICONDUCTOR DEVICE AND MANUFACTURING METHOD THEREOF

CROSS-REFERENCE TO RELATED APPLICATIONS/INCORPORATION BY REFERENCE

The present application makes reference to, claims priority to, and claims the benefit of Korean Patent Application No. 10-2014-0012762, filed on Feb. 4, 2014, the contents of which are hereby incorporated herein by reference, in their entirety.

FEDERALLY SPONSORED RESEARCH OR DEVELOPMENT

[Not Applicable]

SEQUENCE LISTING

[Not Applicable]

MICROFICHE/COPYRIGHT REFERENCE

[Not Applicable]

BACKGROUND

Present semiconductor devices and/or manufacturing methods are inadequate, for example resulting in excessively thick, warped, and expensive components. Further limitations and disadvantages of conventional and traditional approaches will become apparent to one of skill in the art, through comparison of such approaches with the various aspects of the present disclosure as set forth in the remainder of the present application with reference to the drawings.

DETAILED DESCRIPTION

Figure 1A:
FIGS. 1a to 1j show cross-sectional views of an example semiconductor device at various stages of processing, in accordance with various aspects of the disclosure.

The following discussion presents various aspects of the present disclosure by providing various examples thereof. Such examples are non-limiting, and thus the scope of various aspects of the present disclosure should not necessarily be limited by any particular characteristics of the provided examples.

As utilized herein, the phrases "for example" and "e.g." are non-limiting and are generally synonymous with "by way of example and not limitation," "for example and not limitation," and the like. Similarly, as utilized herein, the term "exemplary" means serving as a non-limiting example, instance, or illustration.

As utilized herein, "and/or" means any one or more of the items in the list joined by "and/or". As an example, "x and/or y" means any element of the three-element set {(x), (y), (x, y)}. As another example, "x, y, and/or z" means any element of the seven-element set {(x), (y), (z), (x, y), (x, z), (y, z), (x, y, z)}.

As utilized herein the terms "circuits" and "circuitry" refer to physical electronic components (i.e. hardware) and any software and/or firmware ("code") which may configure the hardware, be executed by the hardware, and or otherwise be associated with the hardware. As used herein, for example, a particular processor and memory may comprise a first "circuit" when executing a first one or more lines of code and may comprise a second "circuit" when executing a second one or more lines of code.

As utilized herein, the phrases "operates to" and "is operable to" describe functionality performed by particular hardware, comprising hardware operating in accordance with software instructions. The phrases "operates to" and "is operable to" include "operates when enabled to". For example, a module that operates to perform a particular operation, but only after receiving a signal to enable such operation, is included by the phrase "operates to."

The terminology used herein is for the purpose of describing particular example embodiments only and is not intended to be limiting of the disclosure. As used herein, the singular forms are intended to include the plural forms as well, unless the context clearly indicates otherwise. It will be further understood that the terms "include," "comprise," "including," and/or "comprising," when used in this specification, specify the presence of stated features, integers, steps, operations, elements, and/or components, but do not preclude the presence or addition of one or more other features, integers, steps, operations, elements, components, and/or groups thereof. In other words, such terms are generally described as being open-ended.

It will be understood that, although the terms first, second, etc. may be used herein to describe various elements, components, regions, layers and/or sections, these elements should not be limited by these terms. These terms are only used to distinguish one element from another element, component, region, layer and/or section. Thus, for example, a first element, a first component, a first region, a first layer and/or a first section discussed below could be termed a second element, a second component, a second region, a second layer and/or a second section without departing from the teachings of the present disclosure.

Various aspects of the present disclosure provide a manufacturing method of a semiconductor device that is thin while retaining excellent electrical properties and experiences reduced warpage due to non-use of a printed circuit board (PCB), and a semiconductor device produced by such manufacturing method.

Various aspects of the present disclosure also provide a manufacturing method of a semiconductor device, which can be manufactured at a reduced cost due to non-use of a printed circuit board (PCB), and a semiconductor device produced by such manufacturing method.

In accordance with various aspects of the present invention, there is provided a manufacturing method of a semiconductor device, comprising forming a back end of line (BEOL) layer on a dummy substrate, electrically connecting a semiconductor die to the BEOL layer, firstly encapsulating the BEOL layer and the semiconductor die using a first encapsulant, removing the dummy substrate from the BEOL layer, electrically connecting a solder ball to the BEOL layer, secondly encapsulating the BEOL layer and the solder ball using a second encapsulant, and electrically connecting a semiconductor package to the BEOL layer.

The dummy substrate may, for example, comprise silicon, glass, silicon carbide, sapphire, quartz, ceramic, metal oxide or a metal. The semiconductor package may, for example, be electrically connected to the BEOL layer by a conductive pillar (e.g., formed by plating; formed with a wire, for example a free-standing wire bond wire; etc.) passing through the first encapsulant. The semiconductor die may, for example, be bonded to the BEOL layer using flip chip technology. The solder ball may, for example, be exposed to the outside through the second encapsulant.

The manufacturing method may, for example, further comprise forming a redistribution layer in the first encapsulant to be electrically connected to the BEOL layer. Here, for example, the semiconductor package may be electrically connected to the redistribution layer.

An interposer electrically connected to the BEOL layer may, for example, further be formed in the first encapsulant, and the semiconductor package may, for example, be electrically connected to the interposer.

The forming of the BEOL layer may, for example, comprise forming a dielectric layer having an opening in the dummy substrate, and forming a redistribution layer and a conductive pillar in the dielectric layer. The removing of the dummy substrate may, for example, comprise grinding the dummy substrate, and etching the dummy substrate.

In accordance with various aspects of the present invention, there may be provided a semiconductor device comprising a back end of line (BEOL) layer, a semiconductor die electrically connected to the BEOL layer, a first encapsulant that firstly encapsulates the BEOL layer and the semiconductor die, a solder ball electrically connected to the BEOL layer, a second encapsulant that secondly encapsulates the BEOL layer and the solder ball, and a semiconductor package electrically connected to the BEOL layer.

The semiconductor package may, for example, be electrically connected to the BEOL layer by a conductive pillar passing through the first encapsulant. The semiconductor die may, for example, be bonded to the BEOL layer using flip chip technology. The solder ball may, for example, be exposed to the outside through the second encapsulant.

The semiconductor device may further comprise a redistribution layer formed in the first encapsulant to be electrically connected to the BEOL layer. Here, for example, the semiconductor package may be electrically connected to the redistribution layer.

An interposer electrically connected to the BEOL layer may, for example, further be formed in the first encapsulant, and the semiconductor package may, for example, be electrically connected to the interposer. The BEOL layer may, for example, comprise a dielectric layer, and a redistribution layer and a conductive pillar formed in the dielectric layer.

As described above, in an example manufacturing method of a semiconductor device and an example semiconductor device produced by such a manufacturing method, according to various aspects of the present disclosure, since a printed circuit board (PCB) might not be used, the semiconductor device may be thin, retain excellent electrical properties, and experience reduced warpage.

In addition, in an example manufacturing method of a semiconductor device and an example semiconductor device produced by such a manufacturing method, according to various aspects of the present disclosure, since a printed circuit board (PCB) might not be used, the semiconductor device may be manufactured at a reduced cost, for example relative to a semiconductor device having a PCB.

Various aspects of the present disclosure may be best understood by reference to the following detailed description when read in conjunction with the accompanying drawings.

Hereinafter, various aspects of the present disclosure will be described with reference to FIGS. 1a to 3. Example embodiments of various aspects of the present disclosure will now be described more fully hereinafter with reference to the accompanying drawings; however, such aspects may be embodied in different forms and should not be construed as being limited by characteristics of the example embodiments set forth herein. In the drawing figures, the dimensions of layers and regions may be exaggerated and/or diminished for clarity of illustration. Like reference numerals may generally refer to like elements throughout.

FIGS. 1a to 1j show cross-sectional views of an example semiconductor device at various stages of processing, in accordance with various aspects of the disclosure. Such cross-sectional views may, for example, illustrate various aspects of an example manufacturing method of a semiconductor device in accordance with the present disclosure.

As illustrated by example, in FIG. 1a, a dummy substrate 110A may be prepared, the dummy substrate 110A comprising, for example, a substantially planar top surface and a substantially planar bottom surface. The dummy substrate 110A may, for example, comprise a material comprising silicon, low-grade silicon, glass, silicon carbide, sapphire, quartz, ceramic, metal oxide, a metal or equivalents thereof, etc., but aspects of the present disclosure are not limited thereto.

Next, an example method of forming a back end of line (BEOL) layer 110 on the dummy substrate 110A will be described. In some cases, the BEOL layer 110 may, for example, be the same with and/or comprise a redistribution layer.

Figure 1B:
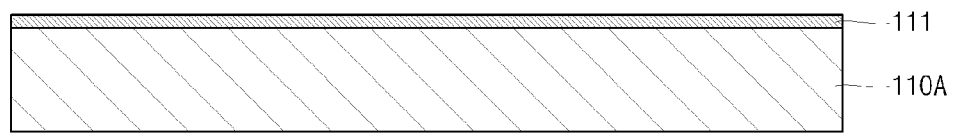

As illustrated by example in FIG. 1b, a dielectric layer 111 may be first deposited on the dummy substrate 110A (e.g., by a chemical vapor deposition (CVD) device), and an opening 111a (or one or more openings) may be formed (e.g., by a photolithography process and/or a laser process). A top surface of the dummy substrate 110A may, for example, be directly exposed to the outside by the opening 111a.

Here, for example, the dielectric layer 111 may be or comprise a material comprising a silicon oxide layer, a silicon nitride layer or equivalents thereof, etc., but aspects of the present disclosure are not limited thereto.

Figure 1C:
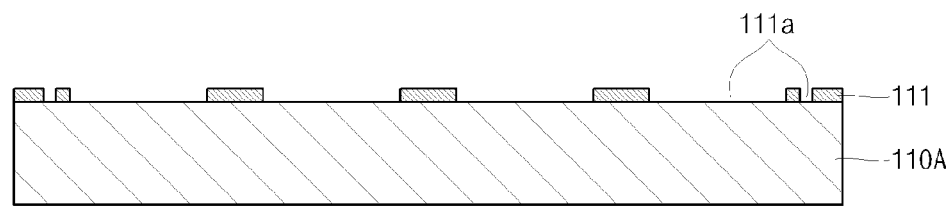

As illustrated by example in FIG. 1c, a redistribution layer 112 may be formed in the opening 111a and on the dielectric layer 111. For example, the redistribution layer 112 may be brought into direct contact with the dummy substrate 110A through the opening(s) 111a. The redistribution layer 112 may, for example, be formed by an electroless plating process for a seed layer using gold, silver, nickel, titanium and/or tungsten, an electroplating process using copper, etc., and/or a photolithography process using photoresist, but aspects of the present disclosure are not limited thereto.

In addition, the redistribution layer 112 may, for example, comprise copper, a copper alloy, aluminum, an aluminum alloy, iron, an iron alloy, or equivalents thereof, etc., but aspects of the present disclosure are not limited thereto.

The forming of the dielectric layer 111 and the forming of the redistribution layer 112 may, for example, be repeatedly performed multiple times, for example forming the BEOL layer 110 having a multi-layered structure.

As described above, the BEOL layer 110 might, for example, comprise only a dielectric layer and a redistribution layer but need not comprise an organic core layer or an organic build-up layer, like in a conventional PCB (e.g., a rigid PCB or a flexible PCB). Therefore, the redistribution layer may be formed thinly (e.g., to have a considerable small thickness). For example, the redistribution layer 112 may have a thickness of 10 µm or less. By contrast, a conventional PCB is generally formed to have a thickness of 200 µm to 300 µm.

In addition, as described above, since the BEOL layer 110 may be formed by a fabrication (FAB) process, the redistribution layer 112 may be formed to have a width, thickness and/or pitch in a range of 20 nm to 1000 nm.

Therefore, various aspects of the present disclosure provide a considerably fine redistribution layer 112, for example accommodating highly integrated semiconductor dies. By contrast, the redistribution layer of a conventional PCB is generally formed to have a width, thickness and/or pitch in a range of 20 µm to 30 µm.

In the BEOL layer 110, all or some regions of the redistribution layer 112 may be directly exposed to the outside. A conductive pillar 113, to be described later, may be formed on (e.g., directly on) exposed regions of the redistribution layer 112, and a semiconductor die 120 may be connected to (e.g., directly connected to) exposed regions of redistribution layer 112.

Figure 1D:
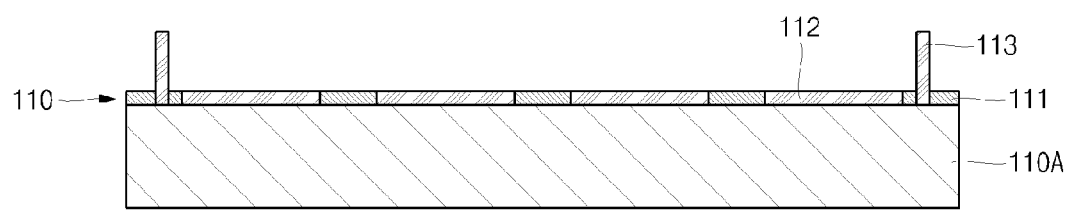

As illustrated by example in FIG. 1d, a conductive pillar 113 (or a plurality thereof) may be formed on (e.g., directly on) the redistribution layer 112, for example to be electrically connected to the semiconductor package 140 to be described later. Here, for example, the conductive pillar 113 may be or comprise a material comprising copper, a copper alloy, aluminum, an aluminum alloy, iron, an iron alloy, or equivalents thereof, etc., but aspects of the present disclosure are not limited thereto.

In addition, since the conductive pillar (or post) 113 may, for example, be generally formed by a general plating process, by a photolithography process, from a narrow free-standing wire (e.g., a wire-bond wire) bonded to the redistribution layer 112, etc., it may be formed to have a width smaller than approximately 50 µm. Therefore, a considerably fine conductive pillar 113 may be formed, for example compared to the conventional art. In an example, the conductive pillar 113 may allow the semiconductor package 140 to accommodate approximately 400 or more input/output terminals. In a comparative example, a solder ball formed on the conventional BEOL layer may be formed to have a diameter of approximately 200 µm or greater.

In addition, since the conductive pillar 113 may be electrically connected to the semiconductor package 140 positioned relatively far from the conductive pillar 113, the conductive pillar 113 may be formed to have a height equal to or greater than a height of the semiconductor die 120 to be described later.

In the illustrated embodiment, the conductive pillar 113 and the redistribution layer 112 are separated from each other, but they may be electrically connected to each other in practice.

Figure 1E:
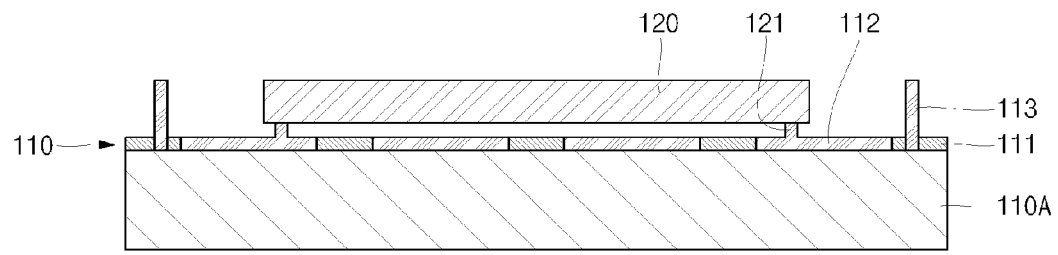

As illustrated by example in FIG. 1e, the semiconductor die 120 may be electrically connected to the BEOL layer 110. For example, a bonding pad, a copper pillar, or a bump 121 of the semiconductor die 120 may be electrically connected to the BEOL layer 110. In addition, the semiconductor die 120 may be electrically connected to the BEOL layer 110 using flip-chip technology.

The connection of the semiconductor die 120 may, for example, be achieved by a general thermal compression process, a mass reflow process and/or an equivalent thereof, etc., but aspects of the present disclosure are not limited thereto.

Here, for example, the semiconductor die 120 may have a thickness of approximately 50 µm to 70 µm, but aspects of the present disclosure are not limited thereto.

As discussed above, the conductive pillar 113 may have a height greater than or equal to the height of the semiconductor die 120. In various examples, however, the height of the conductive pillar 113 may also be smaller than the height of the semiconductor die.

An underfill (not shown) may, for example, be injected into a space between the semiconductor die 120 and the BEOL layer 110, followed by curing. The underfill may, for example, make the semiconductor die 120 more stably fixed on the BEOL layer 110. Even if, for example, there is a difference in respective thermal expansion coefficients between the semiconductor die 120 and the BEOL layer 110, the semiconductor die 120 and the BEOL layer 110 are not electrically disconnected from each other.

In various examples, if the first encapsulant 130 to be described later is viscous enough to flow into a gap between the semiconductor die 120 and the BEOL layer 110, since the first encapsulant 130 may be directly filled in the gap between the semiconductor die 120 and the BEOL layer 110, the underfill might not be utilized.

Figure 1F:
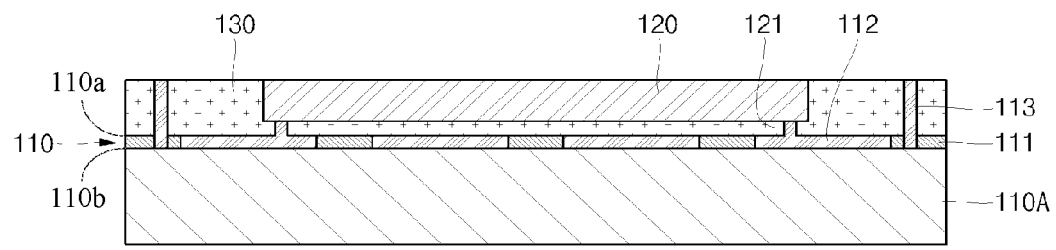

As illustrated by example in FIG. 1f, the semiconductor die 120 and the conductive pillar 113 formed on the BEOL layer 110 may be firstly encapsulated by the first encapsulant 130. Therefore, the semiconductor die 120 and the conductive pillar 113 may be additionally protected from external surroundings. Here, the first encapsulant 130 may be brought into close contact with the BEOL layer 110 (e.g., at a first side 110a of the BEOL layer 110) and may completely encapsulate the semiconductor die 120 or may expose a top surface of the semiconductor die 120 (e.g., with or without thinning or grinding).

The encapsulating may, for example, be achieved by a general transfer molding process, a compression process, an injection molding process and an equivalent thereof, etc., but aspects of the present disclosure are not limited thereto.

The first encapsulant 130 may, for example be or comprise a material selected from: a general epoxy, a film, a paste and equivalents thereof, etc., but aspects of the present disclosure are not limited thereto. For example, the BEOL layer 110, the semiconductor die 120 and the conductive pillar 113 may be cohesively integrated with each other by the first encapsulant 130.

After the first encapsulating, a grinding process may further be performed. In the grinding process, for example, the first encapsulant 130 and the semiconductor die 120 may be subjected to the grinding process (e.g., by or to a predetermined thickness), thereby reducing the thickness of the semiconductor device and/or encapsulant.

Figure 1G:
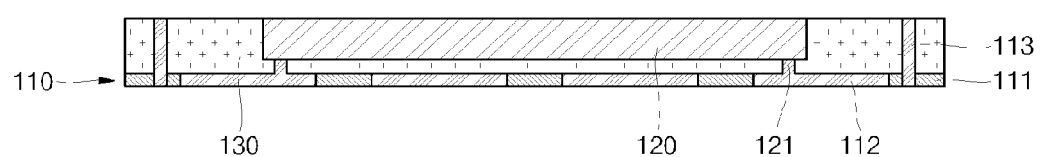

As illustrated by example in FIG. 1g, the dummy substrate 110A may be removed from the BEOL layer 110. For example, the first encapsulant 130 may be held by a wafer support system. Then, the dummy substrate 110A may be removed, for example, to a predetermined thickness through a grinding process, and then completely removed by a dry and/or wet etching process.

For example, a region (e.g., a bottom surface) of the redistribution layer 112 of the BEOL layer 110 may be exposed to the outside through the dielectric layer 111. For example, a seed layer (using, for example, gold, silver, nickel, titanium and/or tungsten) may be directly exposed to the outside through the dielectric layer 111. Preferably, gold and/or silver may be directly exposed to the outside through the dielectric layer 111 to, for example, facilitate connection with a conductive ball (e.g., a solder ball) or another semiconductor device in a subsequent process.

Figure 1H:
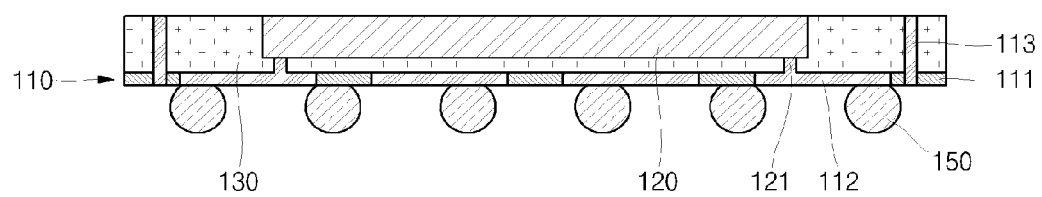

As illustrated by example in FIG. 1h, the solder ball 150 may be connected to the redistribution layer 112 exposed to the outside (e.g., the bottom) through the dielectric layer 111. For example, a volatile flux may be coated on a predetermined region of the redistribution layer 112 exposed to the outside (the bottom) through the dielectric layer 111, and the solder ball 150 may be positioned on the flux, followed by applying heating to a temperature of approximately 130° C. to 250° C., thereby making the flux volatilize and connecting the solder ball 150 to a predetermined region of the redistribution layer 112. Thereafter, a cooling process may be performed to solidify the solder ball 150 and complete the mechanically/electrically connection to the redistribution layer 112.

Figure 1I:
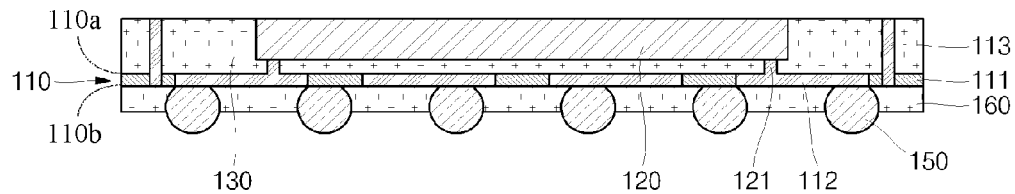

As illustrated by example in FIG. 1i, the BEOL layer 110 and the solder ball 150 may be secondly encapsulated using a second encapsulant 160. For example, the second encapsulant 160 may cover not only the dielectric layer 111 and the redistribution layer 112 of the BEOL layer 110 (e.g., at a second side 110b of the BEOL layer 110) but also a region (a lateral region) of the solder ball 150. Here, for example, the solder ball 150 may be exposed to the outside (e.g., the bottom) through the second encapsulant 160.

In another example, after the BEOL layer 110 is secondly encapsulated using the second encapsulant 160, the solder ball 150 may be electrically connected to the BEOL layer 110, for example through and/or through openings in the second encapsulant. For example, during the second encapsulating, a region of the redistribution layer 112 forming the BEOL layer 110 may be exposed to the outside (e.g., the bottom).

Figure 1J:
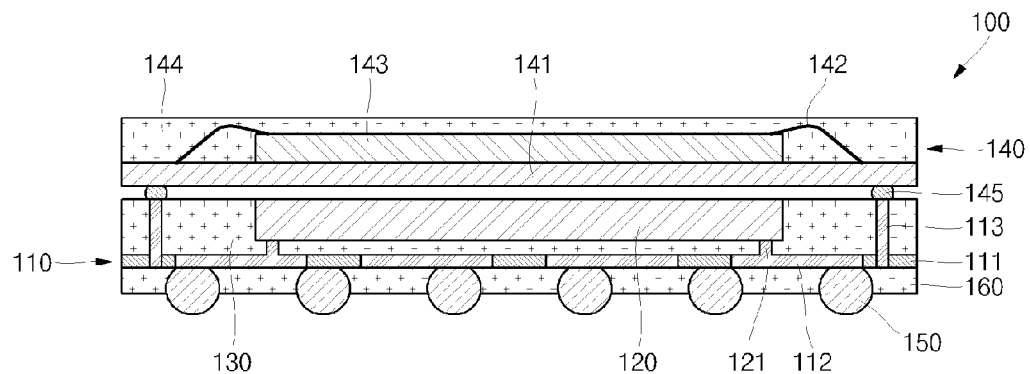

As illustrated by example in FIG. 1j, the semiconductor package 140 may be electrically connected to the BEOL layer 110. For example, the semiconductor package 140, comprising a substrate 141, a semiconductor die 143 bonded to the substrate 141 (e.g., by a conductive wire 142 or in a flip-chip configuration), and an encapsulant 144 encapsulating the substrate 141 and the semiconductor die 143, may be connected to the solder bump (or ball) 145 and the conductive pillar 113, thereby electrically connecting the semiconductor package 140 to the BEOL layer 110.

For example, the semiconductor die 120 may be an AP (processor) and the semiconductor die 143 may be an LPDDR (memory), but aspects of the present disclosure are not limited thereto.

As described above, since the conventional PCB is not used, various aspects of the present disclosure provide the semiconductor device 100 having a small thickness and excellent electrical properties while suppressing warpage. For example, the semiconductor device 100 having a thickness of approximately 100 μm to 200 μm may be provided using a BEOL layer having a thickness of approximately 10 μm or less. In addition, the semiconductor device 100 having excellent electrical properties (e.g., having a relatively small power loss and/or having relatively low susceptibility to noise) is provided by the redistribution layer having a width, thickness and/or pitch in a range of 20 nm to 30 nm. Further, since the dielectric layer included in the BEOL layer may be made of an inorganic material, it has a thermal expansion coefficient similar to (or the same as) that of each of the semiconductor die 120 and the first and second encapsulants 130 and 160, thereby providing a semiconductor device 100 that is substantially less susceptible to warpage.

In addition, since top and bottom surfaces of the BEOL layer 110 may be surrounded by the first and second encapsulants 130 and 160, the BEOL layer 110 can be protected from external surroundings.

Further, according to various aspects of the present disclosure, the BEOL layer may be formed using existing deposition equipment, plating equipment or photolithography equipment without having to purchase the conventional high-priced PCB, thereby providing the semiconductor device 100 at a reduced manufacturing cost.

The previous discussion provided a non-limiting example of a method for producing a semiconductor device, and a semiconductor device produced by such method, in accordance with various aspects of the present disclosure. Additional examples will now be provided and discussed with regard to FIG. 2 and FIG. 3.

Figure 2:
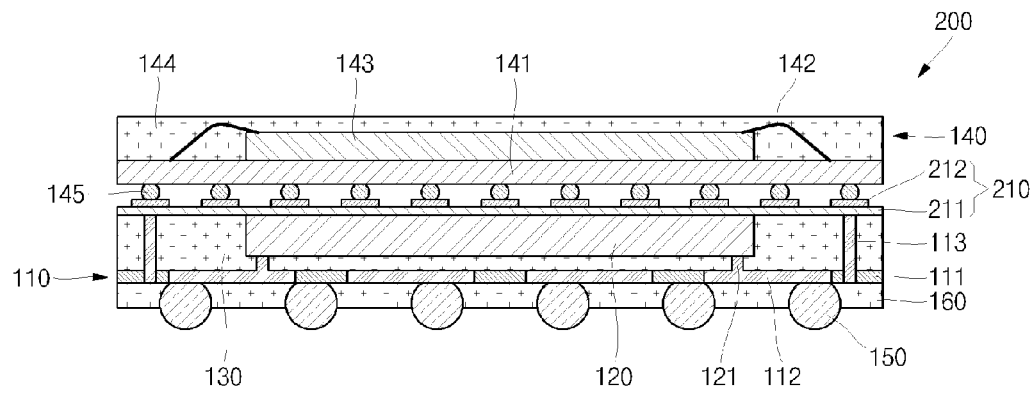
FIG. 2 shows a cross-sectional view of an example semiconductor device, in accordance with various aspects of the disclosure.

FIG. 2 shows a cross-sectional view of an example semiconductor device (200) in accordance with various aspects of the disclosure. The example semiconductor device 200 may share any or all characteristics with the example semiconductor device 100 shown in various stages in FIGS. 1a-1j.

As illustrated in FIG. 2, the semiconductor device 200 may comprise a redistribution layer 210 formed on a surface of the first encapsulant 130 to be electrically connected to the BEOL layer 110. In addition, the semiconductor package 140 may be electrically connected to the redistribution layer 210.

For example, the redistribution layer 210 may be electrically connected to the BEOL layer 110 through the conductive pillar 113. In addition, the redistribution layer 210 may comprise a dielectric layer 211 formed on the surface of the first encapsulant 130 using, for example, polyimide or polyamide, and a redistribution layer 212 formed on a surface of the dielectric layer 211 using, for example, copper or a copper alloy.

As described above, in the illustrated example semiconductor device 200, the redistribution layer 210 may be additionally used, thereby accommodating a large number of input/output terminals in the semiconductor package 140 and placement flexibility for such terminals.

Figure 3:
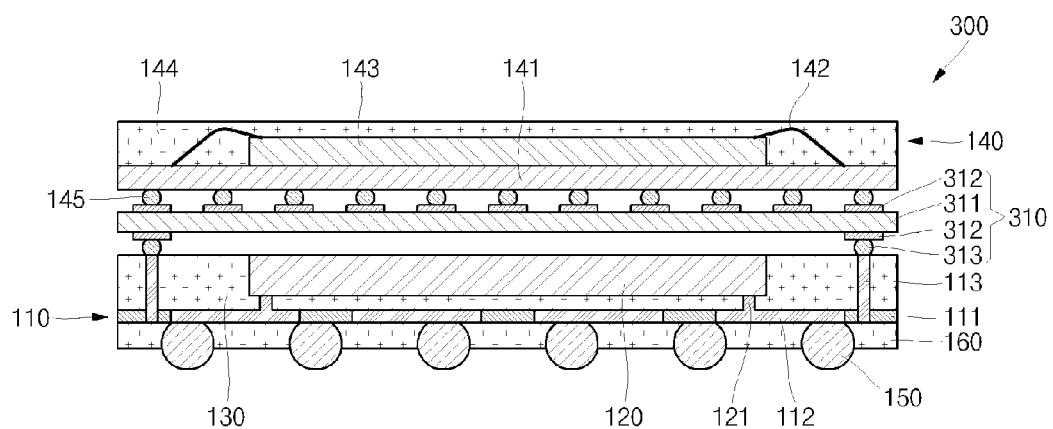
FIG. 3 shows a cross-sectional view of an example semiconductor device, in accordance with various aspects of the disclosure.

FIG. 3 shows a cross-sectional view of an example semiconductor device (300) in accordance with various aspects of the disclosure. The example semiconductor device 300 may share any or all characteristics with the example semiconductor device 100 shown in various stages in FIGS. 1a-1j and/or the example semiconductor device 200 shown in FIG. 2.

As illustrated in FIG. 3, the semiconductor device 300 may further comprise an interposer 310 (e.g., a bottom surface thereof) electrically connected to the BEOL layer 110 and positioned on the first encapsulant 130. A semiconductor package 140 may, for example, be electrically connected to a surface (e.g., a top surface) of the interposer 310.

For example, the interposer 310 may be electrically connected to the BEOL layer 110 through a conductive pillar 113. In addition, the interposer 310 may comprise a dielectric layer 311 formed on the surface of the first encapsulant 130 using, for example, silicon, polyimide or polyamide, a redistribution layer 312 formed on top and bottom surfaces of the dielectric layer 311 using, for example, copper or a copper alloy, and solder balls 313 electrically connecting the redistribution layer 312 and conductive pillars 113 to each other.

As described above, in the illustrated example semiconductor device 300, the interposer 310 is additionally used, thereby accommodating a large number of input/output terminals in the semiconductor package 140 and placement flexibility for such terminals.

This disclosure provides exemplary embodiments of various aspects of the present disclosure. The scope of the present disclosure is not limited by these example embodiments. Numerous variations, whether explicitly provided for by the specification or implied by the specification, such as variations in structure, dimension, type of material and manufacturing process, may be implemented by one skilled in the art in view of this disclosure.

In summary, various aspects of the present disclosure provide a semiconductor device and a manufacturing method thereof. While the foregoing has been described with reference to certain aspects and embodiments, it will be understood by those skilled in the art that various changes may be made and equivalents may be substituted without departing from the scope of the disclosure. In addition, many modifications may be made to adapt a particular situation or material to the teachings of the disclosure without departing from its scope. Therefore, it is intended that the disclosure not be limited to the particular embodiment(s) disclosed, but that the disclosure will include all embodiments falling within the scope of the appended claims.

What is claimed is:

1. A method of manufacturing a semiconductor device, the manufacturing method comprising:
   mounting and electrically connecting a semiconductor die to a back end of line (BEOL) layer on a dummy substrate;
   after said mounting and electrically connecting, first encapsulating a first side of the BEOL layer and at least side surfaces of the semiconductor die using a first encapsulant;
   after said first encapsulating, removing the dummy substrate from the BEOL layer;
   after said first encapsulating, forming a redistribution layer on a side of the first encapsulant opposite the BEOL layer, wherein the redistribution layer comprises an RDL dielectric layer and an RDL conductive layer that is electrically connected to the BEOL layer;
   electrically connecting a conductive ball to the BEOL layer;
   second encapsulating a second side of the BEOL layer opposite the first side and the conductive ball using a second encapsulant; and
   forming a conductive pillar that passes completely through the first encapsulant, wherein the conductive pillar has a height equal to a height of the semiconductor die.

2. The method of claim 1, wherein the dummy substrate comprises one or more of: silicon, glass, silicon carbide, sapphire, quartz, ceramic, metal oxide and/or a metal.

3. The method of claim 1, wherein the BEOL layer comprises a BEOL dielectric layer and a BEOL conductive layer, both of which directly contact the dummy substrate prior to said removing the dummy substrate from the BEOL layer.

4. The method of claim 1, wherein said forming the conductive pillar comprises plating the conductive pillar on the BEOL layer.

5. The method of claim 1, wherein said forming the conductive pillar comprises bonding a wire to the BEOL layer.

6. The method of claim 1, comprising removing a top portion of the first encapsulant.

7. The method of claim 1, wherein:
   said second encapsulating is performed after said electrically connecting a conductive ball to the BEOL layer; and
   a first end of the conductive ball is coupled to the BEOL layer, and a second end of the conductive ball opposite the first end is exposed to the outside through the second encapsulant.

8. The method of claim 1, wherein said forming the redistribution layer comprises forming the redistribution layer on the first encapsulant and on the semiconductor die.

9. The method of claim 1, wherein a surface of the semiconductor die opposite the BEOL layer is exposed from the first encapsulant, and said forming the conductive pillar comprises forming the conductive pillar on the BEOL layer.

10. The method of claim 1, comprising forming the BEOL layer on the dummy substrate.

11. A semiconductor device comprising:
    a back end of line (BEOL) layer;
    a semiconductor die electrically connected to the BEOL layer;
    a first encapsulant that encapsulates a first side of the BEOL layer and the semiconductor die;
    a redistribution layer on a side of the first encapsulant opposite the BEOL layer, wherein the redistribution layer comprises an RDL dielectric layer and an RDL conductive layer that is electrically connected to the BEOL layer;
    a conductive ball electrically connected to the BEOL layer;
    a second encapsulant that encapsulates a second side of the BEOL layer and the conductive ball, such that sides of the BEOL layer are exposed from the first and second encapsulants; and
    a conductive pillar extending from the BEOL layer and completely through the first encapsulant, wherein the conductive pillar has a height equal to a height of the semiconductor die.

12. The semiconductor device of claim 11, wherein the BEOL layer comprises an inorganic dielectric layer and a conductive layer.

13. The semiconductor device of claim 11, wherein the conductive pillar comprises a plated conductive pillar plated on the BEOL layer.

14. The semiconductor device of claim 11, wherein the conductive pillar comprises a wire connected to the BEOL layer.

15. The semiconductor device of claim 11, wherein:
    a surface of said second encapsulant conforms to a shape of the conductive ball; and
    a first end of the conductive ball is coupled to the BEOL layer, and a second end of the conductive ball opposite the first end is exposed to the outside through the second encapsulant.

16. The semiconductor device of claim 11, wherein the redistribution layer is on a side of the first encapsulant opposite the BEOL layer and on a side of the semiconductor die opposite the BEOL layer.

17. The semiconductor device of claim 11, wherein a surface of the semiconductor die opposite the BEOL layer is exposed from the first encapsulant.

18. A method of manufacturing a semiconductor device, the manufacturing method comprising:
    forming a conductive pillar on a first redistribution layer on a dummy semiconductor substrate on which no semiconductor devices are fabricated;

mounting and electrically connecting a semiconductor die to the first redistribution layer;

after said mounting and electrically connecting, encapsulating the first redistribution layer, the semiconductor die, and the conductive pillar with a first encapsulant;

after said encapsulating, forming a second redistribution layer on a side of the first encapsulant opposite the first redistribution layer, wherein the second redistribution layer comprises an RDL dielectric layer and an RDL conductive layer that is electrically connected to the first redistribution layer; and after said encapsulating, removing the dummy semiconductor substrate, wherein said forming a conductive pillar comprises one or both of attaching a wire to the redistribution layer and/or plating the conductive pillar attached to the redistribution layer, and wherein the conductive pillar has a height equal to a height of the semiconductor die.

19. The method of claim 18, wherein said forming the second redistribution layer comprises forming the second redistribution layer on the first encapsulant and on the semiconductor die.

20. The method of claim 18, wherein the BEOL layer comprises a BEOL dielectric layer and a BEOL conductive layer, both of which directly contact the dummy semiconductor substrate prior to said removing the dummy semiconductor substrate.

21. A method of manufacturing a semiconductor device, the manufacturing method comprising:

mounting and electrically connecting a semiconductor die to a first layer on a substrate, where the first layer comprises a first dielectric material and a first conductive material;

after said mounting and electrically connecting, depositing a first encapsulant on a first side of the first layer and on at least side surfaces of the semiconductor die;

after said depositing the first encapsulant:
  removing the substrate from the first layer; and
  forming a second layer on a side of the first encapsulant opposite the first layer, wherein the second layer comprises a second dielectric material and a second conductive material that is electrically connected to the first conductive material; and electrically connecting a conductive ball to the first layer;

wherein said forming a conductive pillar comprises one or both of attaching a wire to the redistribution layer and/or plating the conductive pillar attached to the redistribution layer, and wherein the conductive pillar has a height equal to a height of the semiconductor die.

22. The method of claim 21, wherein the substrate comprises a semiconductor substrate, and prior to said removing the substrate from the first layer, both of the first dielectric material and the first conductive material directly contact the semiconductor substrate.

23. The method of claim 22, wherein the first dielectric material comprises an inorganic dielectric layer formed directly on the semiconductor substrate.

24. The method of claim 21, wherein said removing the substrate from the first layer comprises grinding the substrate.

25. The method of claim 21, wherein said forming the second layer comprises forming the second dielectric material directly on the first encapsulant and directly on the semiconductor die.

26. The method of claim 21, wherein said forming the conductive pillar is performed before said mounting and electrically connecting the semiconductor die.

* * * * *